United States Patent
Sayama

(10) Patent No.: US 9,129,841 B2
(45) Date of Patent: Sep. 8, 2015

(54) SEMICONDUCTOR DEVICE INCLUDING A HIGH VOLTAGE P-CHANNEL TRANSISTOR AND METHOD FOR MANUFACTURING THE SAME

(75) Inventor: Hirokazu Sayama, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 404 days.

(21) Appl. No.: 13/313,620

(22) Filed: Dec. 7, 2011

(65) Prior Publication Data
US 2012/0153388 A1  Jun. 21, 2012

(30) Foreign Application Priority Data
Dec. 21, 2010 (JP) .................. 2010-284396

(51) Int. Cl.
*H01L 21/8234* (2006.01)
*H01L 27/088* (2006.01)
*H01L 27/092* (2006.01)
*H01L 21/8238* (2006.01)

(52) U.S. Cl.
CPC .... *H01L 27/0922* (2013.01); *H01L 21/823814* (2013.01); *H01L 21/823857* (2013.01); *H01L 21/823892* (2013.01)

(58) Field of Classification Search
CPC ... H01L 29/78; H01L 21/336; H01L 21/8234; H01L 27/088
USPC .......... 257/337, 339, 355, 335, 371, E21.417; 438/286, 275
See application file for complete search history.

(56) References Cited

U.S. PATENT DOCUMENTS

| | | | | |
|---|---|---|---|---|
| 5,541,435 | A * | 7/1996 | Beasom | 257/409 |
| 6,888,207 | B1 * | 5/2005 | Hebert | 257/409 |
| 8,097,905 | B2 * | 1/2012 | Tsuchiko | 257/272 |
| 2005/0224857 | A1 * | 10/2005 | Kimizuka et al. | 257/310 |
| 2007/0215949 | A1 * | 9/2007 | Kijima | 257/355 |

(Continued)

FOREIGN PATENT DOCUMENTS

JP  2007-251082 A  9/2007

OTHER PUBLICATIONS

Aghoram, et al. "Effect of mechanical stress on LDMOSFETs: Dependence on orientation and gate bias." *Int Sym Pow Semicond.* (2009): 220-223.

(Continued)

*Primary Examiner* — Sheng Zhu
(74) *Attorney, Agent, or Firm* — McDermott Will & Emery LLP

(57) ABSTRACT

A semiconductor device in which a reliable high voltage p-channel transistor is formed without an increase in cost and the number of manufacturing steps. The transistor includes: a semiconductor substrate having a main surface and a p-type region therein; a p-type well region located over the p-type region and in the main surface, having a first p-type impurity region to obtain a drain electrode; an n-type well region adjoining the p-type well region along the main surface and having a second p-type impurity region to obtain a source electrode; a gate electrode between the first and second p-type impurity regions along the main surface; and a p-type buried channel overlying the n-type well region and extending along the main surface. The border between the n-type and p-type well regions is nearer to the first p-type impurity region than the gate electrode end near to the first p-type impurity region.

10 Claims, 11 Drawing Sheets

(56) References Cited

U.S. PATENT DOCUMENTS

2009/0212360 A1* 8/2009 Knaipp ............... 257/335
2010/0244106 A1* 9/2010 Parker et al. ............ 257/288

OTHER PUBLICATIONS

Japanese Office Action issued in Application No. 2010-284396 dated Apr. 8, 2014.

* cited by examiner

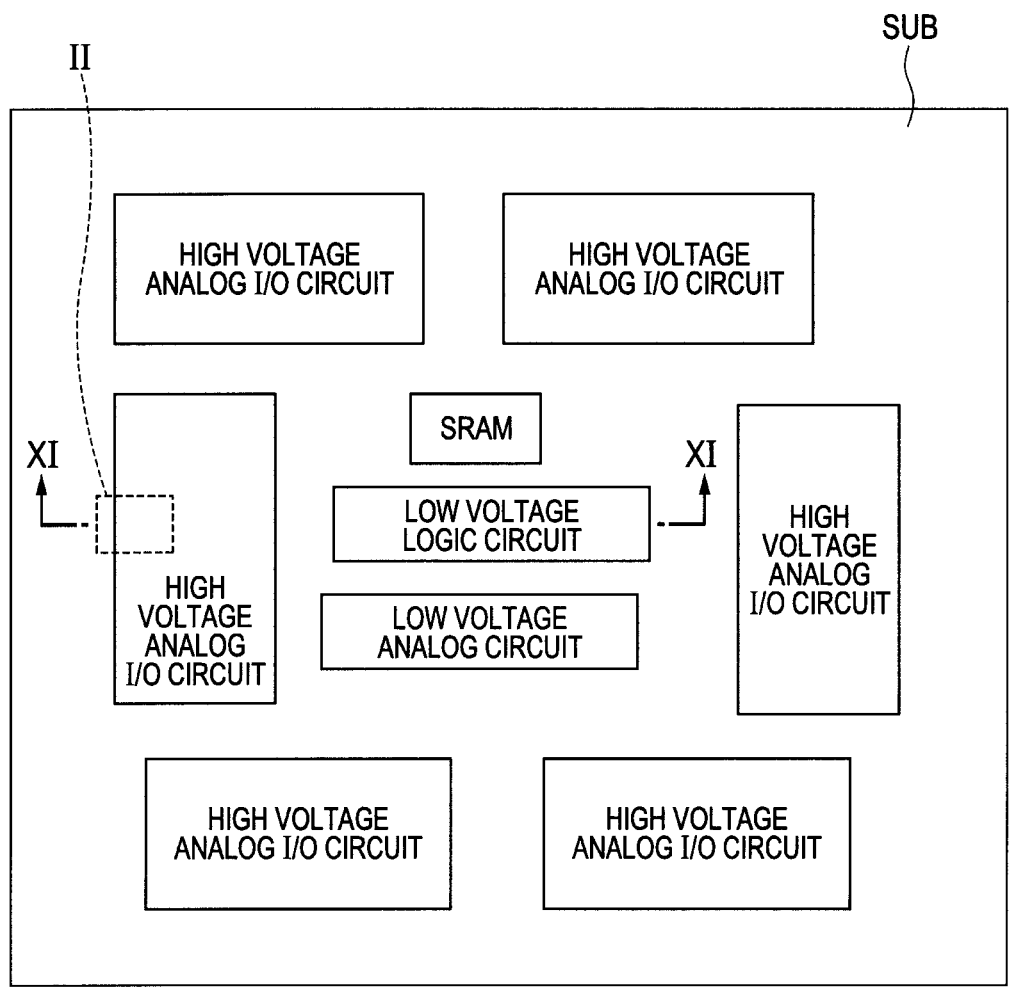

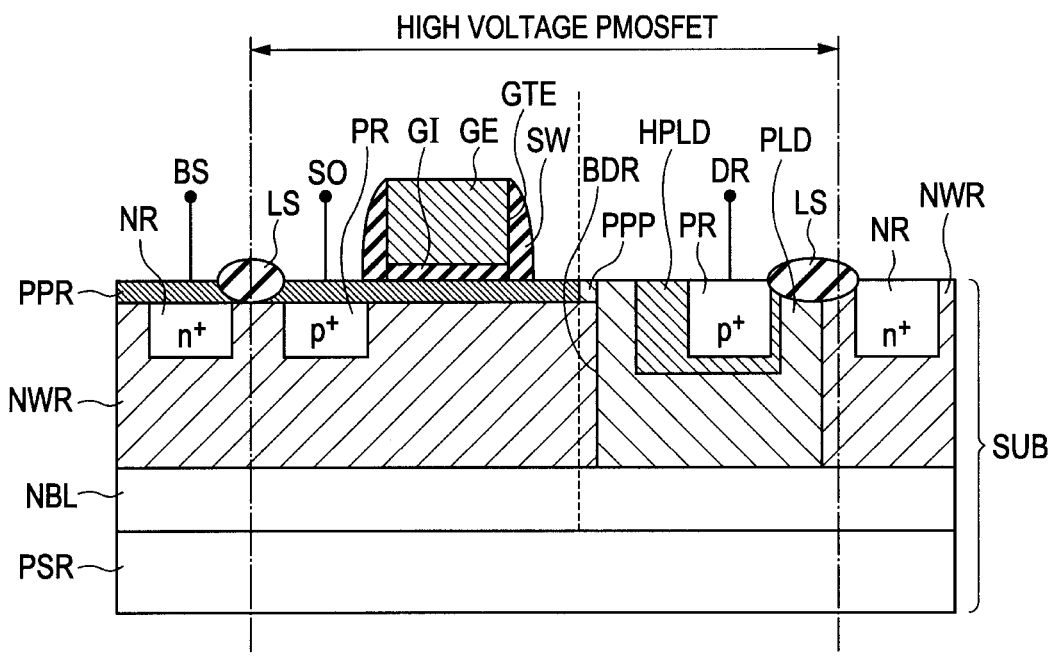
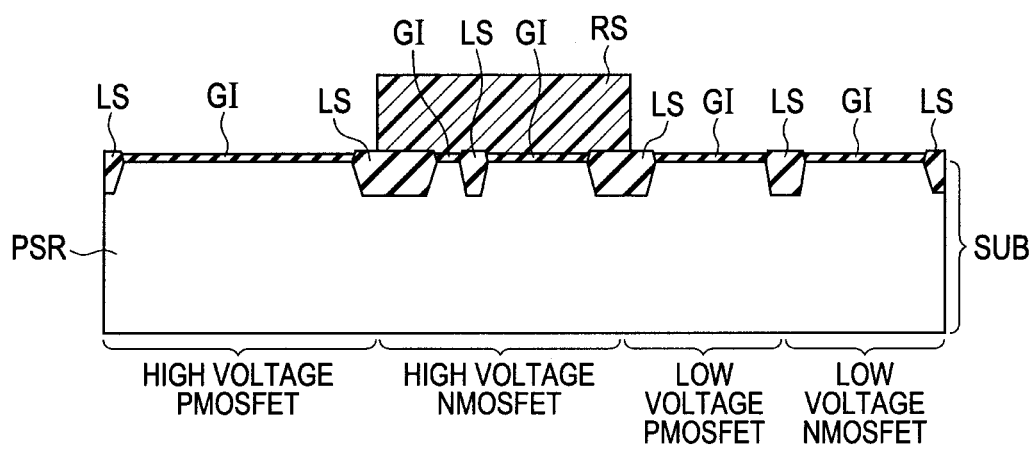

SEMICONDUCTOR DEVICE INCLUDING A HIGH VOLTAGE P-CHANNEL TRANSISTOR AND METHOD FOR MANUFACTURING THE SAME

CROSS-REFERENCE TO RELATED APPLICATIONS

The disclosure of Japanese Patent Application No. 2010-284396 filed on Dec. 21, 2010 including the specification, drawings and abstract is incorporated herein by reference in its entirety.

BACKGROUND

The present invention relates to a semiconductor device and a method for manufacturing the same and more particularly to a semiconductor device having a high voltage p-channel transistor and a method for manufacturing the same.

A high voltage p-channel MIS (Metal Insulator Semiconductor) transistor is a transistor in which the region between a gate electrode and a drain electrode is larger than an ordinary p-channel MIS transistor and the p-type impurity concentration of the region is low. In this type of transistor, the electric field between the gate electrode and drain electrode is mitigated, so the withstand voltage is high. For example, a p-channel MIS transistor which uses a wider p-type well region than usual as an impurity region to obtain a drain electrode is disclosed in "Effect of mechanical stress on LDMOSFETs: Dependence on orientation and gate bias," authored by Aghoram U, Liu J, Chu M, Koehler A D, Thompson S E, Sridhar S, Wise R, Pendharkar S, Denison M (USA, IEEE, ISPSD '09, 2009, pp. 220-223). In this case, the p-type well region coupled to the drain electrode stretches to the gate electrode from the drain electrode in away to overlap the gate electrode in a plan view.

SUMMARY

In the MOS (Metal Oxide Semiconductor) transistor described in the above document, special impurities other than the impurities contained in the n-type well region for the formation of the transistor are not doped in the so-called channel region just below the gate electrode. In other words, the channel region of the transistor is a so-called surface channel in which the state of carriers is controlled according to the voltage applied to the gate electrode. Since the surface channel transistor is lower in reliability than the buried channel type transistor which will be described next, the buried channel type transistor is often used instead of the surface channel transistor.

In many cases, a high voltage p-channel MIS transistor is used in combination with a so-called low voltage MIS transistor. The low voltage MIS transistor here means a transistor which operates at a lower drain voltage than a high voltage transistor such as a high voltage p-channel MIS transistor. The low voltage MIS transistor is a component of the logic circuit of a semiconductor device and the combination of the low voltage MIS transistor and high voltage transistor provides an integrated circuit which can operate at high speed with low power consumption. If the low voltage MIS transistor is of the buried channel type which has an n-type gate electrode, the high voltage transistor to be combined with it must be of the buried channel type for the convenience of the manufacturing process.

MIS transistors with a buried channel require more manufacturing steps than MIS transistors with a surface channel because the steps to form the buried channel are needed. Usually, in manufacturing a MIS transistor with a buried channel, an extra mask for the formation of the buried channel must be prepared. However, the following method is sometimes adopted to make a MIS transistor with a surface channel and a MIS transistor with a buried channel simultaneously without using an extra mask.

For example, when making a MIS transistor with a buried p-channel, in the process of forming an n-type well region in a semiconductor substrate the buried channel is formed using the same mask temporally continuously. Specifically, immediately after the n-type well region is formed, the buried channel is formed over the well region without changing the mask. By adopting this method, for example, the n-type well region and buried channel region for the p-channel MIS transistor and the well region for the low voltage p-channel MIS transistor can be all formed using the same mask.

However, when the p-type buried channel is formed without a time break just after the formation of the n-type well region, the distance for which the p-type buried channel spreads in the direction along the main surface is shorter than the distance for which the n-type well region spreads in the same direction. The reason for this is that the boron impurities doped by ion implantation to form the p-type buried channel have a lower energy than the phosphorous impurities doped by ion implantation to form the n-type well region and the distance for which the boron impurities disperse is shorter. Therefore, in a portion of the n-type well region which is near to the p-type region on the neighboring drain region side (for example, low doped p-type impurity region), a region in which the p-type impurity concentration attributable to the p-type buried channel is very low is formed. If such a region with a very low p-type impurity concentration is formed just below the gate electrode, a region with a very high gate threshold voltage is formed in the region with a very low p-type impurity concentration. This means that the drain current of the p-channel MIS transistor may drop or the reliability of the whole semiconductor device including the p-channel MIS transistor may deteriorate.

In short, when the n-type well region and p-type buried channel are formed using the same mask temporally continuously as mentioned above, a problem may arise because the width of the n-type well region in the main surface direction is not equal to the width of the p-type buried channel in the same direction. This problem can be easily avoided by forming the n-type well region and p-type buried channel using different masks at different steps. However, in that case, the number of masks to be prepared and the number of required manufacturing steps would increase, leading to higher cost.

The present invention has been made in view of the above circumstances and has an object to provide a semiconductor device in which a reliable high voltage p-channel transistor is formed without increase in manufacturing cost and the number of manufacturing steps and provide a method for manufacturing the same.

According to a first aspect of the present invention, there is provided a semiconductor device which is structured as follows. The semiconductor device has a high voltage p-channel transistor. The high voltage p-channel transistor includes: a semiconductor substrate having a main surface and a p-type region therein; a p-type well region located over the p-type region and in the main surface, having a first p-type impurity region to obtain a drain electrode; an n-type well region located in a way to adjoin the p-type well region in a direction along the main surface, having a second p-type impurity region to obtain a source electrode; a gate electrode located between the first p-type impurity region and the second p-type impurity region in the direction along the main surface; and a p-type buried channel located over the n-type well region, extending along the main surface. The border between the n-type well region and the p-type well region is located nearer to the first p-type impurity region than the gate electrode's end near to the first p-type impurity region.

According to a second aspect of the present invention, there is provided a semiconductor device which is structured as follows. The semiconductor device has a high voltage p-channel transistor. The high voltage p-channel transistor includes: a semiconductor substrate having a main surface and a p-type region therein; a p-type well region located over the p-type region and in the main surface, having a first p-type impurity region to obtain a drain electrode; an n-type well region located in a way to adjoin the p-type well region in a direction along the main surface, having a second p-type impurity region to obtain a source electrode; a gate electrode located between the first p-type impurity region and the second p-type impurity region in the direction along the main surface; and a p-type buried channel located over the n-type well region, extending along the main surface. In the device, an insulating layer overlapping the gate electrode end near to the first p-type impurity region in a plan view and having a sufficient thickness to reach a deeper level than a bottom of the p-type buried channel is located in the main surface of the semiconductor substrate.

According to a third aspect of the invention, there is provided a semiconductor device manufacturing method which includes the following steps. The semiconductor device manufacturing method is a method for manufacturing a semiconductor device with a high voltage p-channel transistor. In the process for forming the high voltage p-channel transistor, first a semiconductor substrate having a main surface and a p-type region therein is prepared. A p-type well region having a first p-type impurity region to obtain a drain electrode is formed over the p-type region and in the main surface. An n-type well region having a second p-type impurity region to obtain a source electrode is formed in a way to adjoin the p-type well region in a direction along the main surface. A p-type buried channel located over the n-type well region, extending along the main surface is formed. A gate electrode is formed between the first p-type impurity region and the second p-type impurity region in the direction along the main surface. The step of forming the n-type well region and the step of forming the p-type buried channel are carried out using a mask temporally continuously. The n-type and p-type well regions are formed so that a border between the n-type well region and the p-type well region is located nearer to the first p-type impurity region than the gate electrode's end near to the first p-type impurity region.

According to a fourth aspect of the invention, there is provided a semiconductor device manufacturing method which includes the following steps. The semiconductor device manufacturing method is a method for manufacturing a semiconductor device with a high voltage p-channel transistor. In the process for forming the high voltage p-channel transistor, first a semiconductor substrate having a main surface and a p-type region therein is prepared. A p-type well region having a first p-type impurity region to obtain a drain electrode is formed over the p-type region and in the main surface. An n-type well region having a second p-type impurity region to obtain a source electrode is formed in a way to adjoin the p-type well region in a direction along the main surface. A p-type buried channel located over the n-type well region, extending along the main surface is formed. A gate electrode is formed between the first p-type impurity region and the second p-type impurity region in the direction along the main surface. The step of forming the n-type well region and the step of forming the p-type buried channel are carried out using a mask temporally continuously. The method further comprising the step of forming an insulating layer overlapping the gate electrode end near to the first p-type impurity region in a plan view and having a sufficient thickness to reach a deeper level than a bottom of the p-type buried channel in the main surface of the semiconductor substrate.

In the semiconductor device according to the present invention, though the p-type buried channel is formed using the same mask as used for the n-type well region temporally continuously, the region with a very low impurity concentration formed in the p-type buried channel is not located just below the gate electrode. This makes it less likely to cause a decrease in the field effect in the p-type buried channel just below the gate electrode. Therefore, it is possible to provide a semiconductor device which hardly causes a drop in the transistor drain current due to a decrease in the gate threshold voltage and prevents deterioration in the reliability of the whole semiconductor device including the p-channel MIS transistor.

In the semiconductor device manufacturing method according to the present invention, the manufacturing cost is reduced because the p-type buried channel is formed using the same mask as used for the n-type well region temporally continuously. Also it is possible to provide a semiconductor device which hardly causes a drop in the transistor drain current due to a decrease in the gate threshold voltage and prevents deterioration in the reliability of the whole semiconductor device including the p-channel MIS transistor.

BRIEF DESCRIPTION OF THE DRAWINGS

FIG. 1 is a schematic plan view of a semiconductor device according to a first embodiment of the invention;

FIG. 2 is a schematic sectional view showing the structure of a high voltage PMOS transistor formed in the area enclosed by dotted line II in FIG. 1;

FIG. 3 is a schematic sectional view showing a first step in the method for manufacturing a semiconductor device including the high voltage PMOS transistor shown in FIG. 2 and a low voltage transistor in its vicinity according to the first embodiment;

DETAILED DESCRIPTION

Figure 4:
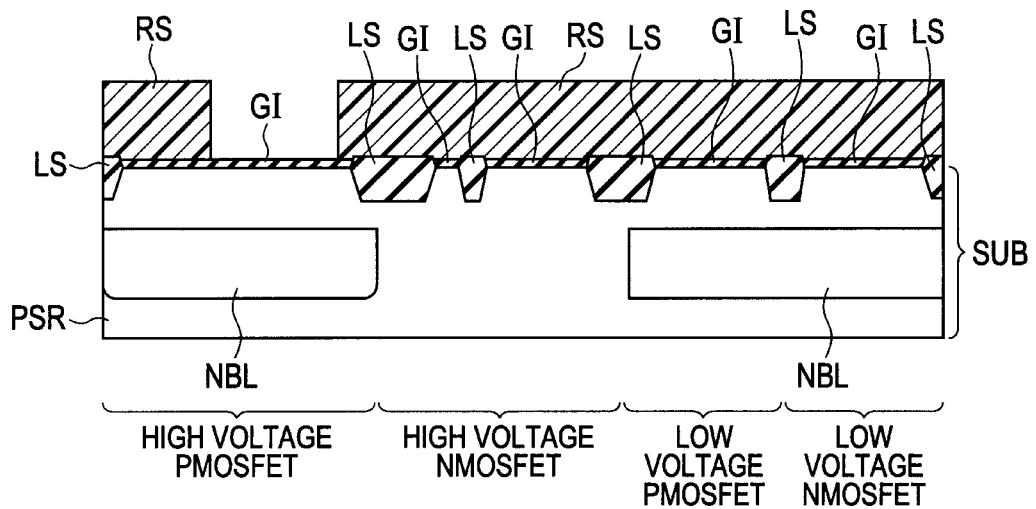
FIG. 4 is a schematic sectional view showing a second step subsequent to the step in FIG. 3 in the semiconductor device manufacturing method according to the first embodiment.

Next, the preferred embodiments of the present invention will be described referring to the accompanying drawings.

First Embodiment

First, the arrangement of device formation regions on the main surface of a semiconductor substrate SUB is described referring to FIG. 1.

Referring to FIG. 1, the semiconductor device according to the first embodiment has, for example, regions for the formation of a high voltage analog I/O circuit, a region for the formation of a low voltage logic circuit, a region for the formation of a low voltage analog circuit, and a region for the formation of a so-called SRAM (Static Random Access Memory) in the main surface of the semiconductor substrate SUB.

The high voltage analog I/O circuits are circuits which can operate at a higher voltage than normal to receive and send electric signals between a power supply circuit and a low voltage logic circuit. For example, the low voltage logic circuit includes a control circuit such as a logic circuit comprised of plural MIS transistors and makes calculations using digital signals. The low voltage analog circuit operates at the same low voltage as the low voltage logic circuit and makes calculations using analog signals. The SRAM includes plural MIS transistors and is used as a memory for data in the semiconductor device. In addition to these, the semiconductor device includes, for example, a region for the formation of the power supply circuit though not shown in the figure. The power supply circuit feeds the supply voltage to start the above circuits.

The high voltage analog I/O circuits shown in FIG. 1 each include, for example, a high voltage PMOS (Metal Oxide Semiconductor) transistor having a p-type buried channel (high voltage p-channel transistor) as shown in FIG. 2 (sectional view). The high voltage PMOSFET here means a p-channel MOS transistor having a high drain voltage of 10 V or more.

Referring to FIG. 2, in the high voltage PMOS transistor, an n-type buried layer NBL, n-type well region NWR, and p-type low doped region (p-type well region) PLD are formed in a semiconductor substrate SUB of, for example, single-crystal silicon. Although FIG. 2 shows more than one n-type well region NWR, the area between a pair of insulating layers LS corresponds to a main part which functions as a high voltage PMOS transistor by itself.

A p-type region PSR is formed inside the semiconductor substrate SUB. The n-type buried layer NBL, n-type well region NWR, and p-type low doped region (p-type well region) PLD are formed over the p-type region PSR.

The p-type low doped region PLD and n-type well region NWR are formed in a way to adjoin the n-type buried layer NBL. However, the p-type low doped region PLD and n-type well region NWR need not always adjoin the n-type buried layer NBL.

The left n-type well region NWR and p-type low doped region PLD which are shown in FIG. 2 are so located as to adjoin each other in the direction along the main surface of the semiconductor substrate SUB (horizontal direction in FIG. 2) at a border BDR.

An n-type impurity region NR and a second p-type impurity region PR are formed inside the left n-type well region NWR shown in FIG. 2. A p-type buried channel PPR extending in the direction along the main surface of the semiconductor substrate SUB is formed over the n-type well region NWR. The n-type impurity region NR has a function to fix the potential of the n-type well region NWR by coupling base potential BS above it to the n-type well region NWR electrically. The second p-type impurity region PR is a region formed in order to obtain, for example, the source electrode SO of the PMOS transistor.

A p-type high doped region HPLD is formed inside the p-type low doped region PLD and further a first p-type impurity region PR is formed inside the p-type high doped region HPLD. The p-type high doped region HPLD is intended to make electrical coupling between the p-type low doped region PLD and the first p-type impurity region PR smoother. The p-type impurity concentration of the p-type high doped region HPLD is higher than the p-type impurity concentration of the p-type low doped region PLD.

The first p-type impurity region PR is intended to obtain, for example, the drain electrode DR of the PMOS transistor. The p-type impurity concentration of the first p-type impurity region PR is higher than the p-type impurity concentration of the p-type high doped region HPLD.

A gate insulating film GI, gate electrode GE, and sidewall insulating film SW for covering their lateral sides are formed over the n-type well region NWR (p-type buried channel PPR), particularly between the first p-type impurity region PR and second p-type impurity region PR.

The gate electrode GE is located nearer to the drain electrode DR (first p-type impurity region PR) than the source electrode SO (second p-type impurity region PR). Consequently, the PMOS transistor has a longer distance between the gate electrode GE and drain electrode DR (first p-type impurity region PR) in the direction along the main surface, resulting in a higher drain voltage.

In the high voltage PMOS transistor according to the first embodiment, the border BDR between the n-type well region NWR and the p-type low doped region PLD is nearer to the drain electrode DR (more rightward in FIG. 2) than the gate electrode GE's end (gate end GTE) near to the drain electrode DR (right in FIG. 2). The p-type buried channel PPR of the high voltage PMOS transistor is electrically coupled to the second p-type impurity region PR and stretches over the main surface of the semiconductor substrate SU along the main surface.

The p-type buried channel PPR extends through the area just below the gate electrode GE, or the whole area overlapping the gate electrode GE in a plan view, reaching a point nearer to the drain electrode DR than the gate end GTE (right in FIG. 2).

A p-type very low doped region PPP is provided in a way to adjoin the drain electrode DR side end of the p-type buried channel PPR. The p-type impurity concentration of the p-type very low doped region PPP is lower than the p-type impurity concentration of the p-type buried channel PPR, that of the p-type impurity regions PR, and that of the p-type low doped region PLD. The p-type impurity concentration of the p-type very low doped region PPP is almost the same as the p-type impurity concentration of the p-type region PSR as the base of the semiconductor substrate SUB.

Here the drain electrode DR side end of the p-type buried channel PPR refers to a portion of the p-type buried channel PPR which has a concentration equivalent to 90% of the concentration of the p-type impurity region PPR in the center of the p-type buried channel PPR in the horizontal direction and is nearer to the drain electrode DR than the center.

In particular, if the high voltage PMOS transistor is miniaturized and the length of its gate electrode GE (horizontal direction in FIG. 2) is decreased, it may be difficult to control the drain current by the gate electrode GE and can cause a punch-through phenomenon. The p-type very low doped region PPP is intended to prevent this and more preferably it ensures that the high voltage PMOS transistor is normally off.

The high voltage PMOS transistor thus configured is formed over the semiconductor substrate SUB together with a so-called high voltage NMOS transistor having an n-type buried channel (high voltage n-channel transistor), making up a high voltage analog I/O circuit. The low voltage logic circuit formed over the semiconductor substrate SUB in parallel with the high voltage analog I/O circuit includes a low voltage p-channel transistor (low voltage PMOS) and a low voltage n-channel transistor (low voltage NMOS). Here "low voltage" means a drain drive voltage which is lower than the drive voltage (drain voltage) at which the high voltage PMOS transistor operates. Generally, the low voltage logic circuit operates at a drain voltage of 5 V or less. Next, the method for manufacturing the semiconductor device according to the first embodiment in which the high voltage analog I/O circuit and low voltage logic circuit are arranged in parallel over the semiconductor substrate SUB will be described referring to FIGS. 3 to 11.

Referring to FIG. 3, a gate insulating film GI, for example, a silicon oxide film ($SiO_2$), is formed over the main surface of each of the region for the formation of a high voltage PMOS transistor, the region for the formation of a high voltage NMOS transistor, the region for the formation of a low voltage PMOS transistor, and the region for a low voltage NMOS transistor. Preferably the thickness of the gate insulating film GI is in the range from 10 nm to 50 nm. Device isolation films LS which electrically separate the devices being formed in these regions are formed in places as required over the main surface. The device isolation films LS are made of silicon oxide and formed by a LOCOS (local oxidation of silicon) or STI (shallow trench isolation) process.

Next, a photoresist RS pattern with an opening corresponding, in a plan view, to the region for the formation of the n-type buried layer NBL, is formed over the main surface of the semiconductor substrate SUB by an ordinary photolithographic technique.

Referring to FIG. 4, an n-type buried layer NBL is formed in a region at least at a given depth under the main surface inside the semiconductor substrate SUB, for example, by implanting phosphorous (P) ions from above the main surface of the semiconductor substrate SUB with an energy in the range from 1 MeV to 5 MeV. The given depth (vertical direction in FIG. 4) should be not less than the thickness of the n-type well region NWR and p-type low doped region PLD to be formed at the next step. Then the photoresist RS shown in FIG. 3 is removed.

Next, a photoresist RS pattern with an opening corresponding, in a plan view, to the region for the formation of the p-type low doped region PLD of the high voltage PMOS transistor, is formed over the main surface of the semiconductor substrate SUB by an ordinary photolithographic technique. The photoresist RS pattern is formed so that the whole p-type low doped region PLD is, in whole, located nearer to the drain electrode (right in FIG. 4) than the region in which the gate electrode GE will be formed at a later step.

Figure 5:
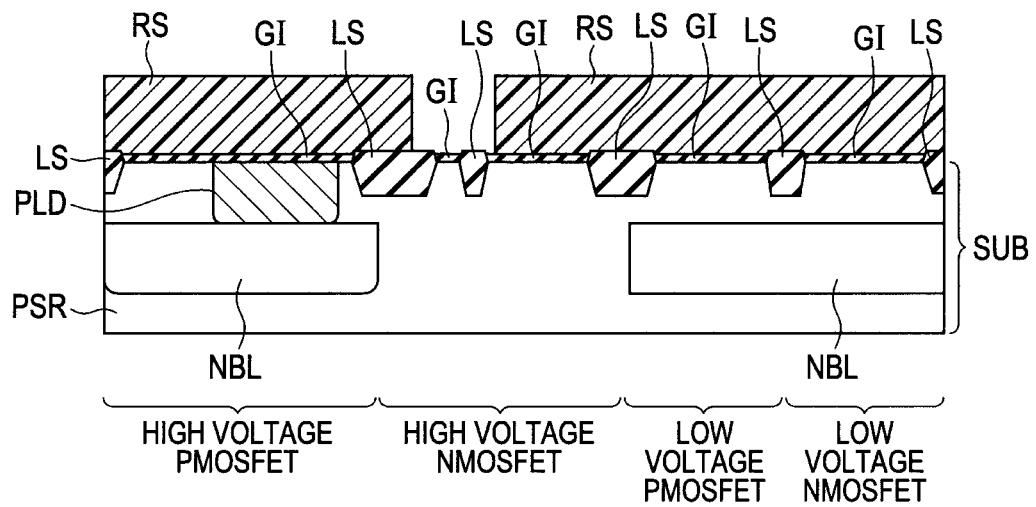
FIG. 5 is a schematic sectional view showing a third step in the semiconductor device manufacturing method according to the first embodiment.

Referring to FIG. 5, for example, boron (B) or boron fluoride ($BF_2$) ions are implanted from above the main surface of the semiconductor substrate SUB with an energy in the range from 20 KeV to 500 KeV. Consequently, a p-type low doped region PLD is formed over the n-type buried layer NBL in the high voltage PMOSFET region. Then, the photoresist RS shown in FIG. 4 is removed.

Next, a photoresist RS pattern with an opening corresponding, in a plan view, to the region for the formation of the n-type low doped region NLD of the high voltage NMOS transistor, is formed over the main surface of the semiconductor substrate SUB by an ordinary photolithographic technique.

Figure 6:
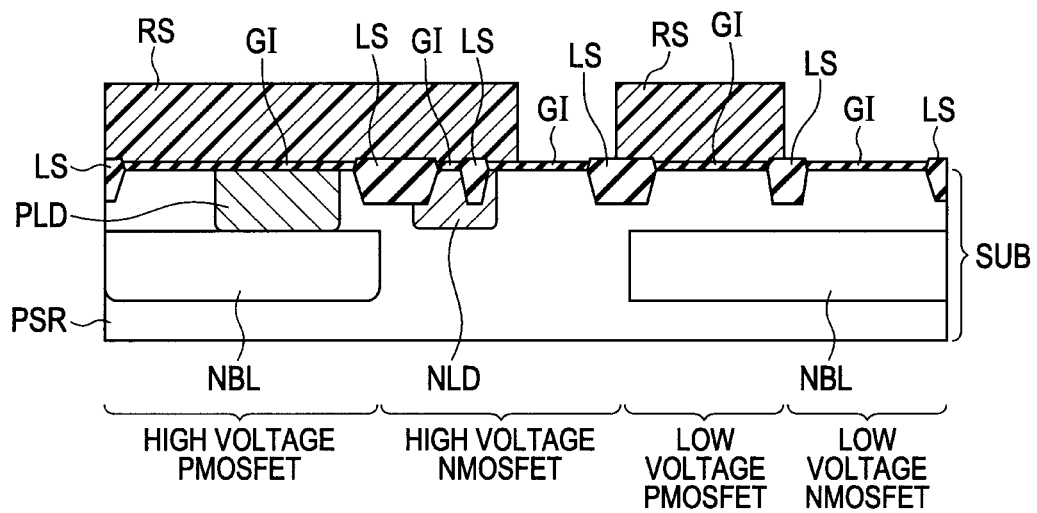
FIG. 6 is a schematic sectional view showing a fourth step in the semiconductor device manufacturing method according to the first embodiment.

Referring to FIG. 6, for example, phosphorous ions are implanted from above the main surface of the semiconductor substrate SUB with an energy in the range from 20 keV to 2000 keV. Consequently an n-type low doped region NLD is formed in the high voltage NMOSFET region in a way to adjoin the main surface (gate insulating film GI) of the semiconductor substrate SUB. The thickness of the n-type low doped region NLD is, for example, almost the same as the p-type low doped region PLD. Then the photoresist RS shown in FIG. 5 is removed.

Next, a photoresist RS pattern with openings corresponding, in a plan view, to the regions for the formation of the p-type well regions PWR in the high voltage NMOSFET region and low voltage NMOSFET region, is formed over the main surface of the semiconductor substrate SUB by an ordinary photolithographic technique.

Figure 7:
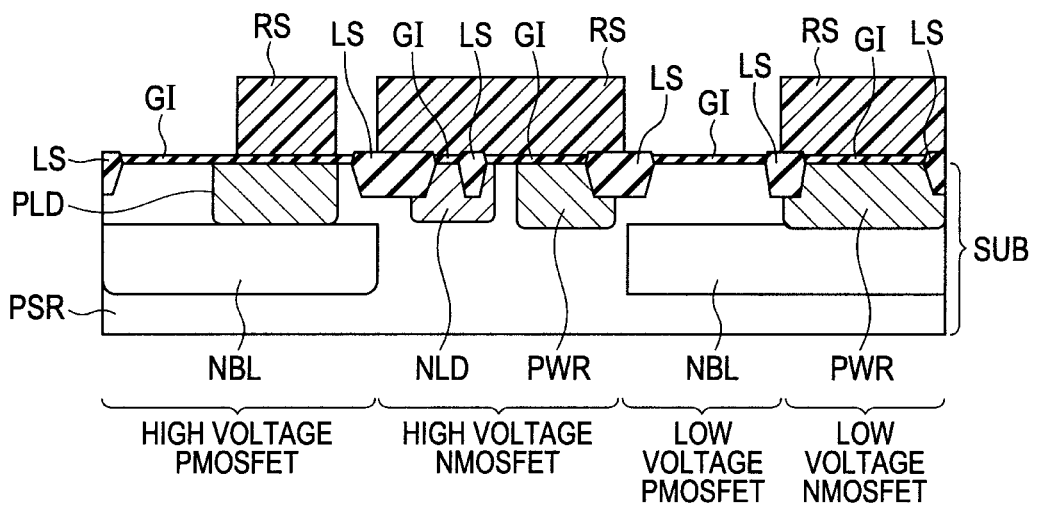
FIG. 7 is a schematic sectional view showing a fifth step in the semiconductor device manufacturing method according to the first embodiment.

Referring to FIG. 7, for example, boron ions are implanted from above the main surface of the semiconductor substrate SUB with an energy in the range from 20 keV to 1000 keV. Consequently p-type well regions PWR are formed in the high voltage NMOSFET region and low voltage NMOSFET region in a way to adjoin the main surface (gate insulating film GI) of the semiconductor substrate SUB. The thickness of the p-type well regions PWR is, for example, almost the same as that of the p-type low doped region. Then the photoresist RS shown in FIG. 6 is removed.

Next, a photoresist RS pattern with openings corresponding, in a plan view, to the regions for the formation of the n-type well regions NWR of the high voltage PMOSFET region and low voltage PMOSFET region, is formed over the main surface of the semiconductor substrate SUB by an ordinary photolithographic technique. Particularly, the photoresist pattern RS is formed so that the n-type well region NWR formed on the left of the p-type low doped region PLD shown in FIG. 7 adjoins the p-type low doped region PLD in the direction along the main surface.

Figure 8:
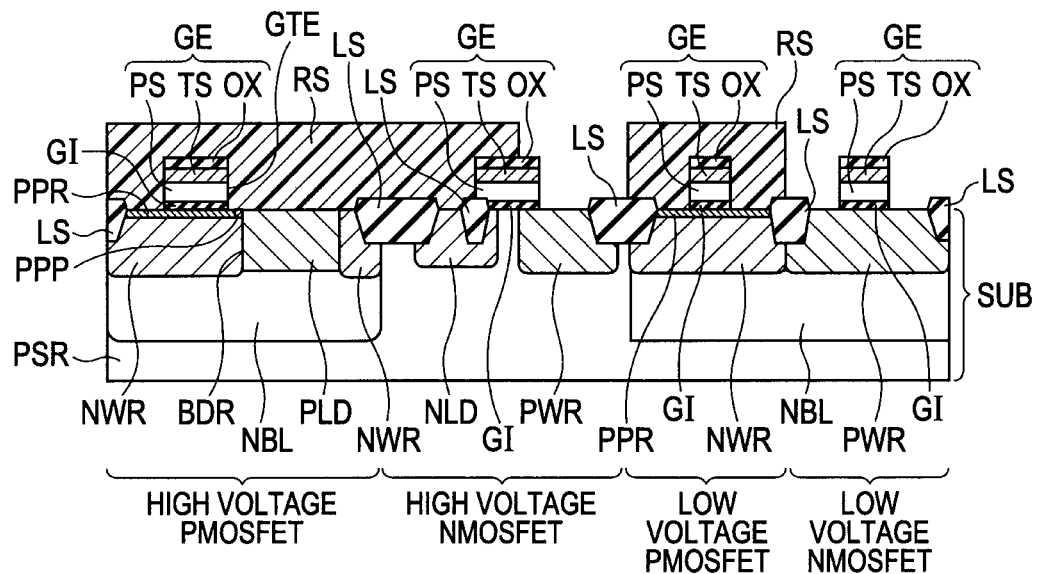
FIG. 8 is a schematic sectional view showing a sixth step in the semiconductor device manufacturing method according to the first embodiment.

Referring to FIG. 8, for example, phosphorous ions are first implanted from above the main surface of the semiconductor substrate SUB with an energy in the range from 150 keV to 2000 keV. Then, for example, boron ions are implanted from above the main surface of the semiconductor substrate SUB with an energy in the range from 20 keV to 50 keV. Consequently a laminate comprised of an n-type well region NWR and a p-type buried channel PPR over it is formed in the high voltage PMOSFET region and low voltage PMOSFET region. In other words, the n-type well region NWR and p-type buried channel PPR are formed using the same photoresist RS (mask) temporally continuously. In this way, the high voltage PMOS and low voltage PMOS transistors are both formed as buried channel transistors. Then the photoresist RS shown in FIG. 7 is removed.

As mentioned above, the p-type low doped region PLD in the high voltage PMOSFET region is, in whole, located nearer to the drain region than the region for the formation of the gate electrode GE. Therefore, the border BDR between the n-type well region NWR and p-type low doped region PLD being formed is located nearer to the drain region than the gate end GTE.

The energy of boron ions implanted to form the p-type buried channel PPR is far lower than the energy of phosphorous ions implanted to form the n-type well region NWR. Therefore, the distance for which the p-type buried channel PPR spreads in the direction along the main surface of the semiconductor substrate SUB is shorter than the distance for which the n-type well region NWR spreads in the same direction. As a consequence, a p-type very low doped region PPP with a very low impurity concentration is formed at the end of the p-type buried channel PPR (right in FIG. 8, particularly in the vicinity of the p-type low doped region PLD of the high voltage PMOSFET region). Preferably the p-type buried channel PPR's end near to the drain electrode DR should be located nearer to the drain electrode DR than the gate end GTE.

At this step, a p-type buried channel PPR is also formed over the right n-type well region NWR in the high voltage PMOSFET region. However, that p-type buried channel PPR is not essential for the operation of the high voltage PMOS transistor, so it is omitted in FIGS. 2 and 8. For the same reason, the p-type very low doped region PPR other than the one over the left n-type well region NWR in the high voltage PMOSFET region is omitted in the figures.

Next, using an ordinary photolithographic technique and an etching technique, agate insulating film GI pattern is formed over the main surface of the semiconductor substrate SUB and a laminate pattern is formed in each region, in which the laminate is comprised of a polycrystalline silicon layer PS, tungsten silicide layer TS and silicon oxide film OX which are stacked in the order of mention. The polycrystalline silicon layer PS, tungsten silicide layer TS and silicon oxide film OX correspond to the gate electrode GE shown in FIG. 2. However, it is acceptable that the gate electrode GE includes neither a tungsten silicide layer TS nor a silicon oxide film OX but it only includes, for example, a polycrystalline silicon layer PS.

Next, a photoresist RS pattern with openings corresponding, in a plan view, to the regions for the formation of extension layers over the p-type well regions PWR in the high voltage NMOSFET region and low voltage NMOSFET region, is formed over the main surface of the semiconductor substrate SUB by an ordinary photolithographic technique.

Figure 9:
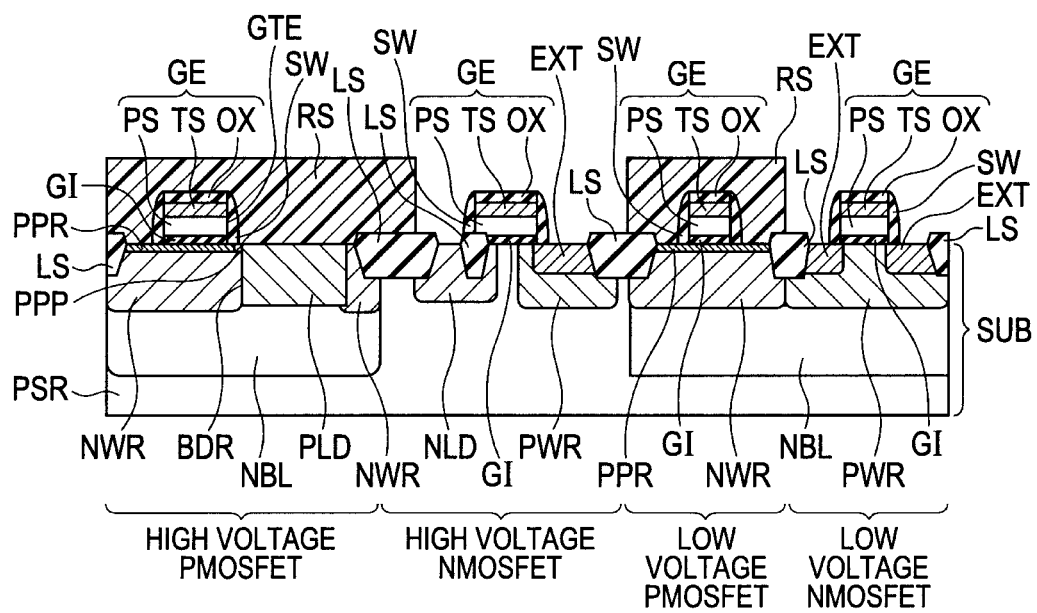
FIG. 9 is a schematic sectional view showing a seventh step in the semiconductor device manufacturing method according to the first embodiment.

Referring to FIG. 9, for example, phosphorous ions are implanted from above the main surface of the semiconductor substrate SUB with an energy in the range from 50 keV to 200 keV. Consequently, extension regions EXT as n-type impurity regions are formed over the p-type well regions PWR in the high voltage NMOSFET region and low voltage NMOSFET region. Then the photoresist RS shown in FIG. 8 is removed.

Next, a silicon oxide film with a thickness in the range from 30 nm to 300 nm is deposited all over the main surface of the semiconductor substrate SUB. Then, the silicon oxide film is shaped into sidewall insulating films SW for covering the lateral sides of the gate electrodes GE and gate insulating films GI by an ordinary photolithographic technique and an etching technique (etch back).

Next, a photoresist RS pattern with openings corresponding, in a plan view, to the regions for the formation of source and drain regions over the n-type low doped region NLD and extension layers EXT in the high voltage NMOSFET region and low voltage NMOSFET region and openings over gate electrodes, is formed over the main surface of the semiconductor substrate SUB by an ordinary photolithographic technique.

Figure 10:
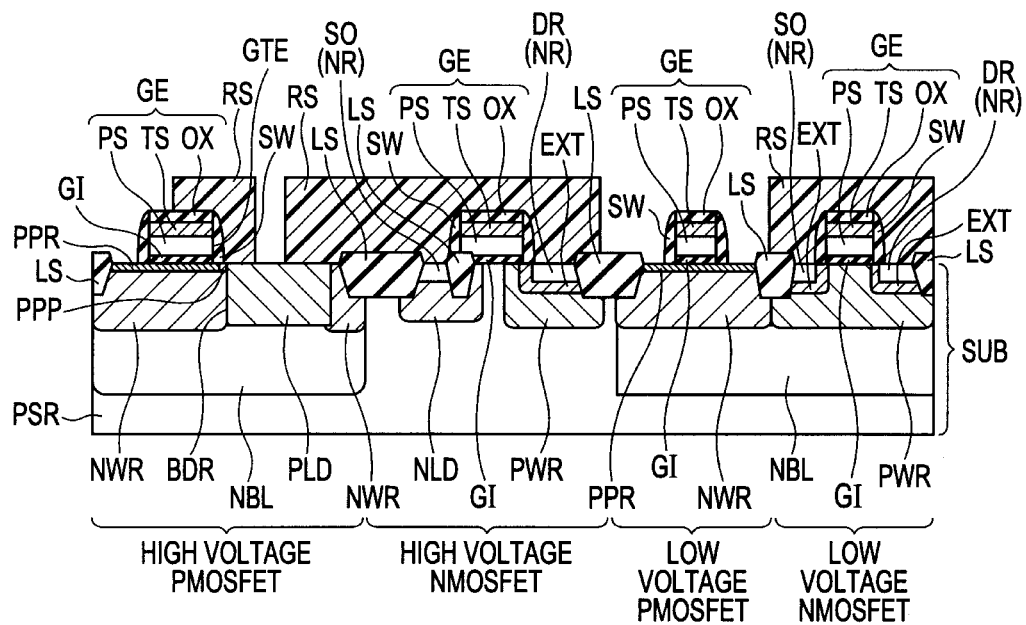
FIG. 10 is a schematic sectional view showing an eighth step in the semiconductor device manufacturing method according to the first embodiment.

Referring to FIG. 10, for example, arsenic (As) ions are implanted from above the main surface of the semiconductor substrate SUB with an energy in the range from 30 keV to 70 keV. Consequently n-type impurity regions NR are formed as source regions SO and drain regions DR over the n-type low doped region NLD and extension regions EXT in the high voltage NMOSFET region and low voltage NMOSFET region. The photoresist RS shown in FIG. 9 and the gate electrodes in the high voltage NMOSFET region and low voltage NMOSFET region function as a mask.

The source region SO is an impurity region to obtain a source electrode and the drain region is an impurity region to obtain a drain electrode. Then the photoresist RS shown in FIG. 9 is removed.

Next, a photoresist RS pattern with openings corresponding, in a plan view, to the regions for the formation of source and drain regions over the n-type well regions NWR and p-type low doped regions PLD in the high voltage PMOSFET region and low voltage PMOSFET region, is formed over the main surface of the semiconductor substrate SUB by an ordinary photolithographic technique.

In this embodiment, however, the openings of the photoresist RS pattern in the high voltage PMOSFET region correspond only to the regions for the formation of the source and drain regions while in the low voltage PMOSFET region the opening occupies almost the whole photoresist RS pattern. This is because the drain region in the high voltage PMOSFET region is formed by a mask offset technique in this embodiment.

Figure 11:
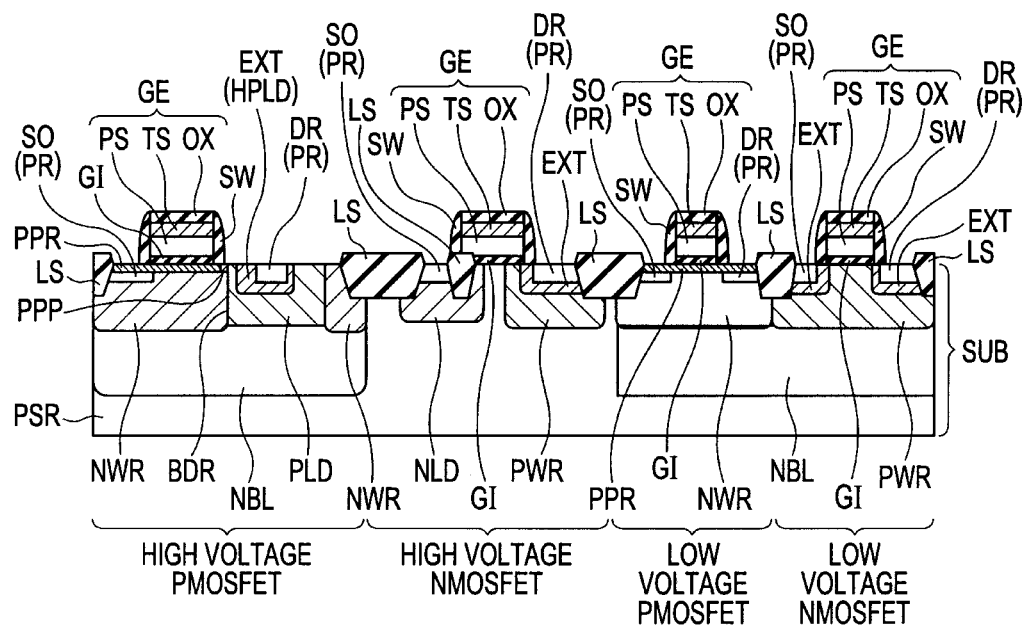
FIG. 11 is a schematic sectional view showing a ninth step in the semiconductor device manufacturing method according to the first embodiment, or a schematic sectional view of a finished semiconductor device, taken along the line XI-XI in FIG. 1.

Referring to FIG. 11, for example, boron fluoride ions are implanted from above the main surface of the semiconductor substrate SUB with an energy in the range from 20 keV to 60 keV. Consequently p-type impurity regions PR are formed as source regions SO and drain regions DR over the n-type well regions NWR and p-type low doped regions PLD in the high voltage PMOSFET region and low voltage PMOSFET region. Then the photoresist RS shown in FIG. 10 is removed. At this time, the p-type impurity regions PR are formed in the high voltage PMOSFET region using the photoresist RS as a mask. On the other hand, the p-type impurity regions PR are formed in the low voltage PMOSFET region using the gate electrode GE as a mask.

It is preferable that before a p-type impurity region PR is formed as a source region SO or drain region DR, a p-type high doped region HPLD with an impurity concentration higher than the p-type low doped region PLD and lower than the p-type impurity regions PR should be formed over the p-type low doped region PLD. After the above steps, for example, the steps of forming a silicide layer, a contact layer and wiring are carried out, though not shown in FIG. 11 so that the high voltage analog I/O circuit and low voltage logic circuit as shown in FIG. 1 (plan view) are formed.

The high voltage PMOSFET structure shown in FIG. 2 is different from those shown in FIGS. 3 to 11, for example, in terms of the shapes of well regions and device isolation films LS. This is because the illustration of FIG. 2 is simplified for easy understanding of the device structure.

The order of the steps shown in FIGS. 3 to 11 is just an example and regarding some of the steps, the order may be reversed. Also the step of implanting impurity ions to form a certain region may be carried out at one time or the step may be divided into several sub-steps. Also heat treatment may be performed as necessary after the removal of the photoresist RS formed at each step. This heat treatment may be performed to adjust the impurity distribution inside each impurity region or prevent crystal defects inside the impurity region.

Next, the effect of the first embodiment will be described referring to FIG. 12 which shows a comparative example.

Figure 12:
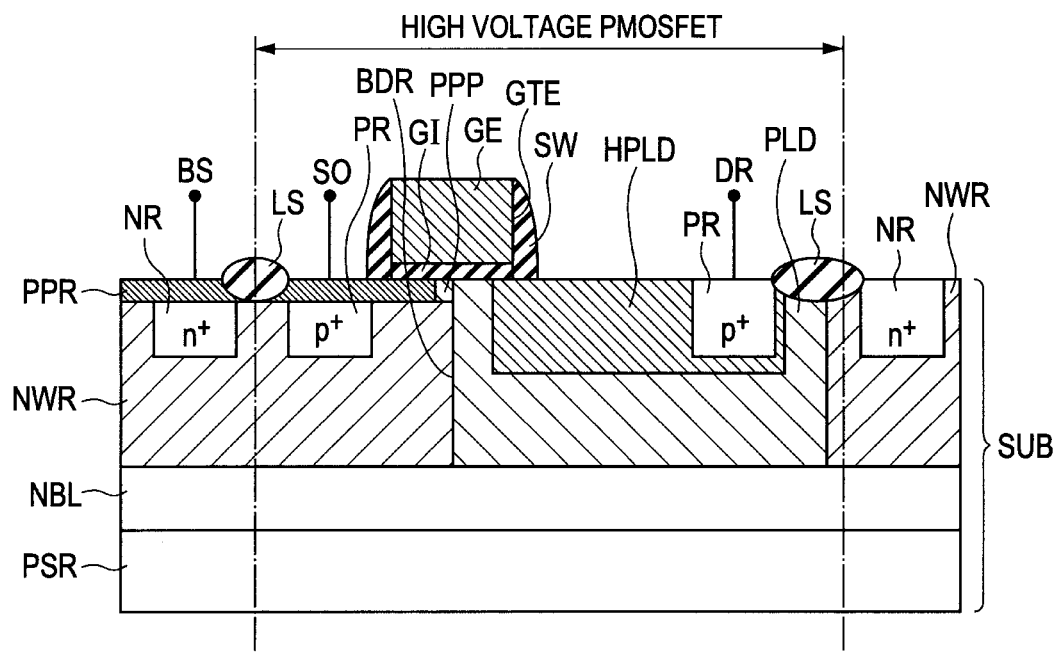
FIG. 12 is a schematic sectional view showing the structure of a high voltage PMOS transistor as a comparative example against the first embodiment.

Referring to FIG. 12, the comparative example is structurally almost the same as the high voltage PMOS transistor shown in FIG. 2. However, in the buried channel device shown in FIG. 12, the border BDR between the n-type well region NWR and p-type low doped region PLD is located just below the gate electrode GE, namely in a way to overlap the gate electrode GE in a plan view. A p-type buried channel PPR is also formed over the main surface of the semiconductor substrate SUB in the high voltage PMOS transistor shown in FIG. 12.

Let's assume that the p-type buried channel PPR of the PMOS transistor shown in FIG. 12 is formed using the same mask as used in forming the n-type well region NWR temporally continuously after the formation of the n-type well region NWR as in the first embodiment. In this case, the p-type buried channel PPR lies over the n-type well region NWR. Therefore, an end of the p-type buried channel PPR is located just below the gate electrode GE and a p-type very low doped region PPP with a very low p-type impurity concentration is formed at the end of the p-type buried channel PPR.

Therefore, the region PPP with a very low impurity concentration lies over the main surface just below the gate electrode GE (gate insulating film GI) in the high voltage PMOS transistor shown in FIG. 12. For this reason, the field effect of the voltage applied to the gate electrode GE may weaken in the region PPP and result in a very high threshold voltage, leading to a very small drain current in the PMOS transistor.

On the other hand, as in this embodiment, if the border BDR between the n-type well region NWR and p-type low doped region PLD is located not just below the gate electrode GE but located nearer to the drain electrode DR than the gate end GTE, the p-type buried channel PPR which is formed temporally continuously using the same mask as used for the n-type well region NWR will spread toward the drain electrode DR along the main surface. Specifically, the end of the p-type buried channel PPR is located nearer to the drain electrode DR than the gate end GTE. This makes it less likely to cause a decrease in the impurity concentration of the p-type buried channel PPR just below the gate electrode GE, thereby preventing a drop in the drain current due to a decrease in the field effect of the gate electrode GE.

Therefore, according to this embodiment, the efficiency in the formation of the n-type well region NWR and p-type buried channel PPR is improved by forming these regions using the same mask temporally continuously. If the n-type well region NWR and p-type buried channel PPR are formed using different masks, the mask production cost is higher and more time is required to form these regions than in the manufacturing method according to this embodiment. Thus, according to this embodiment, it is possible to provide a buried channel high voltage PMOS transistor which reduces the manufacturing cost, assures a sufficient drain current and provides higher reliability than a surface channel transistor.

Furthermore, according to this embodiment, as shown in FIG. 8, the p-type buried channel PPR in the high voltage PMOSFET region and the p-type buried channel PPR in the low voltage PMOSFET region are formed simultaneously (as if they are a common region). This further enhances the efficiency in forming p-type buried channels PPR for several different types of devices over the main surface of the semiconductor substrate SUB. As a consequence, the manufacturing cost can be further reduced.

However, it is preferable that the drain electrode DR side end of the p-type buried channel PPR in this embodiment should be located on the gate electrode GE side with respect to the midpoint between the gate end GTE and the first p-type impurity region PR in the direction along the main surface of the semiconductor substrate SUB. If it is so located, the electrical characteristics of the PMOS transistor are improved.

Second Embodiment

The second embodiment is different from the first embodiment in the point of structure of high voltage PMOS transistor. Next, the high voltage PMOS transistor according to the second embodiment will be described referring to FIGS. 13 to 15.

Figure 13:
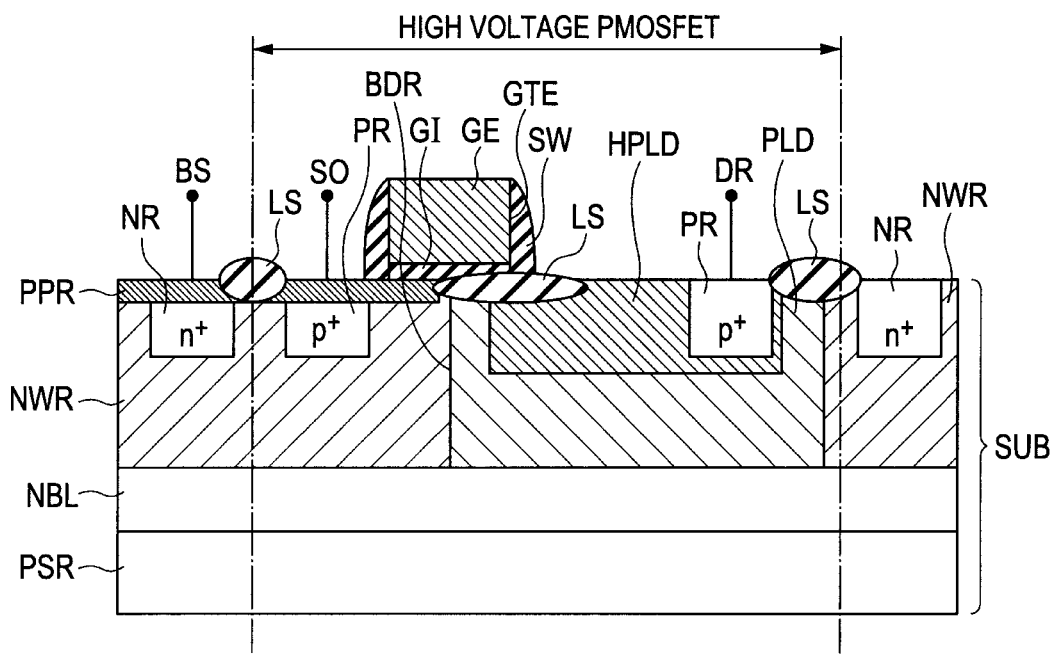
FIG. 13 is a schematic sectional view showing the structure of a high voltage PMOS transistor as a first example of a second embodiment of the invention.

Referring to FIG. 13, the high voltage PMOS transistor as a first example of the second embodiment is structurally almost the same as the high voltage PMOS transistor according to the first embodiment as shown in FIG. 2. However, as shown in FIG. 13, an insulating layer LS as a device isolation film is located in a place where it overlaps the gate end GTE in a plan view. It is preferable that the insulating layer LS should be thick enough to reach a deeper level than the bottom of the p-type buried channel PPR (its lower end in FIG. 13 or the border between the p-type buried channel PPR and n-type well region NWR) in the vertical direction of the figure.

Figure 14:
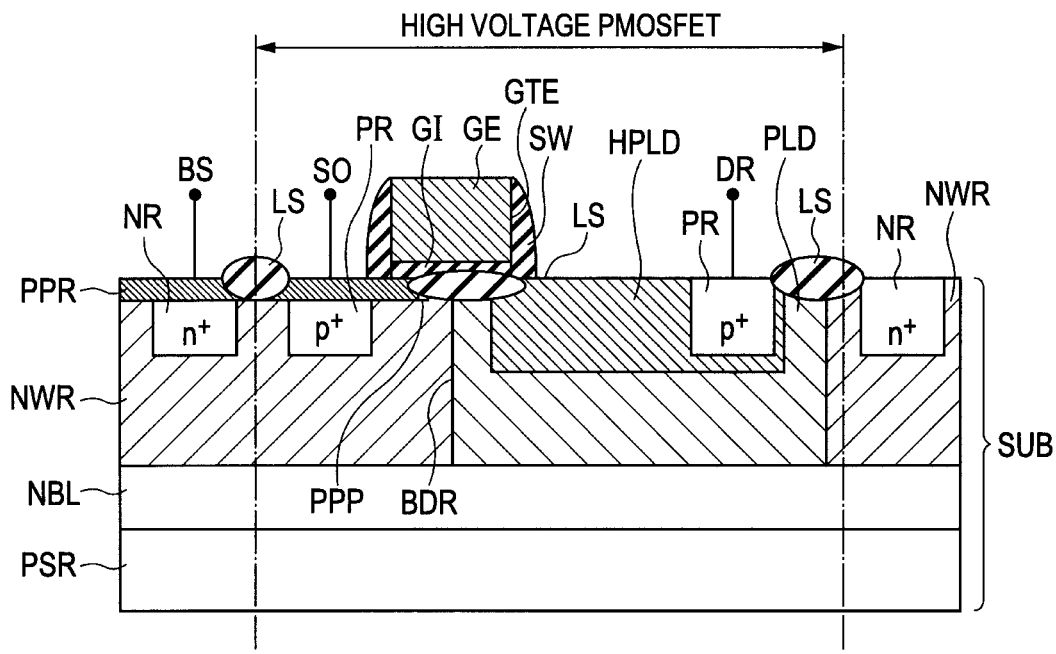
FIG. 14 is a schematic sectional view showing the structure of a high voltage PMOS transistor as a second example of the second embodiment.

The material of the insulating layer LS is the same as the material of the other insulating layers LS in the figure. Preferably at least some part of the insulating layer LS should be located just below the gate end GTE. In the case shown in FIG. 13, the center of the insulating layer LS (in the horizontal direction of the figure) overlaps the gate end GTE in a plan view. Alternatively, as shown in FIG. 14 which illustrates a second example of the second embodiment, the insulating layer LS may be located more left (in the horizontal direction of the figure) than in FIG. 13, overlapping the gate end GTE in a plan view. The example shown in FIG. 14 is different from the example shown in FIG. 13 only in this aspect.

In both the examples shown in FIGS. 13 and 14, preferably the insulating layer LS should have a larger thickness than the p-type buried channel PPR (in the vertical direction of the figures). In other words, the insulating layer LS is so located just below the gate end GTE as to completely block the p-type buried channel PPR extending from the source electrode SO along the main surface of the semiconductor substrate SUB. This means that any part of the p-type buried channel PPR does not exist just below the gate end GTE.

In the examples shown in FIGS. 13 and 14, the border BDR between the n-type well region NWR and p-type low doped region PLD is located just below the gate electrode GE as in FIG. 12. However, it is more preferable that like the first embodiment shown in FIG. 2, the border BDR should be located nearer to the drain electrode DR than the gate end GTE as in a third example of the second embodiment. In this case, preferably the drain electrode DR side end of the p-type buried channel PPR should be located nearer to the drain electrode DR than the gate end GTE.

Figure 15:
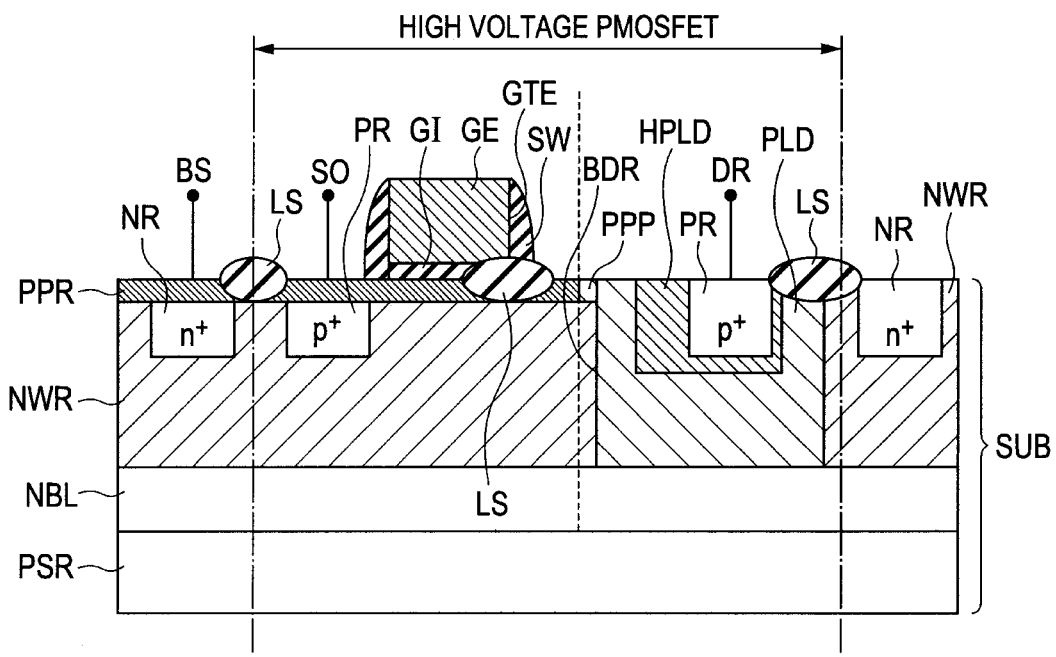
FIG. 15 is a schematic sectional view showing the structure of a high voltage PMOS transistor as a third example of the second embodiment.

The examples of the second embodiment as shown in FIGS. 13 to 15 are structurally different from the first embodiment shown in FIG. 2 in the above aspects but the same as the first embodiment in the other aspects, so the same elements are designated by the same reference numerals and their description is not repeated.

Next, the method for manufacturing the semiconductor device according to the second embodiment which has the high voltage analog I/O circuit including the high voltage PMOS transistor shown in FIG. 13 and the low voltage logic circuit shown in FIG. 1 will be described referring to FIGS. 16 to 19 in the same way as the manufacturing method according to the first embodiment has been described referring to FIGS. 3 to 11.

Figure 16:
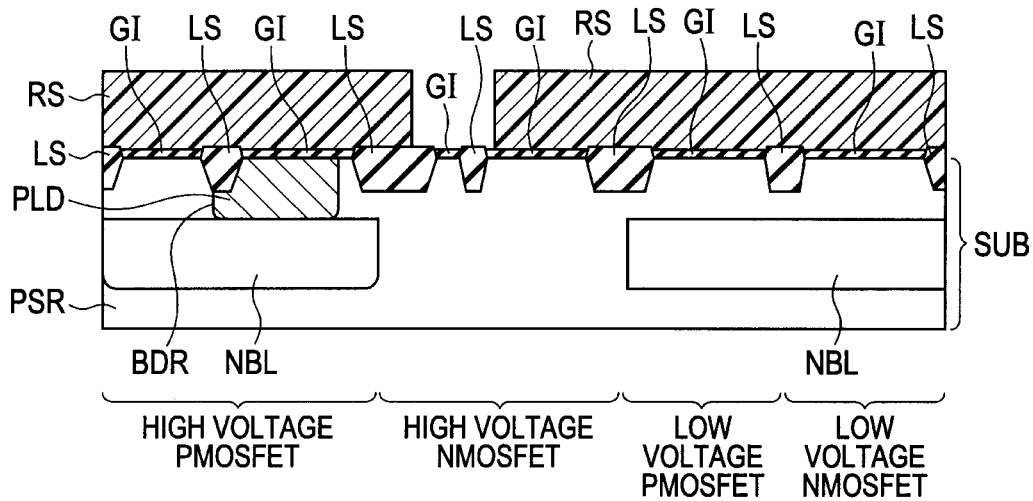
FIG. 16 is a schematic sectional view showing a step equivalent to the step in FIG. 5 in the first embodiment in the method for manufacturing a semiconductor device including the high voltage PMOS transistor shown in FIG. 13 and the low voltage transistor in its vicinity according to the second embodiment.

Referring to FIG. 16, the same steps as those shown in FIGS. 3 to 5 in the first embodiment are carried out in the method for manufacturing the semiconductor device according to the first example (FIG. 13) of the second embodiment. The second embodiment is different from the first embodiment in that a device isolation film LS similar to those in other regions is formed around the center (in the horizontal direction of the figure) of the high voltage PMOSFET region. Preferably this device isolation film LS should be located more left than the p-type low doped region PLD as seen in the figure and vertically extend deeper than the bottom of the p-type buried channel PPR, and have a larger thickness than the p-type buried channel PPR.

Figure 17:
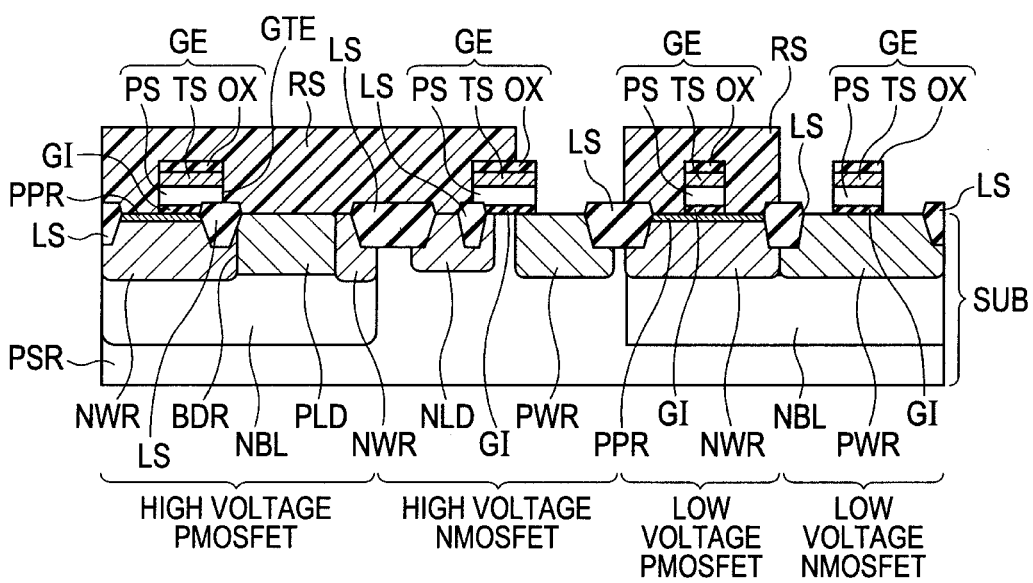
FIG. 17 is a schematic sectional view showing a step equivalent to the step in FIG. 8 in the first embodiment in the method for manufacturing a semiconductor device including the high voltage PMOS transistor shown in FIG. 13 and the low voltage transistor in its vicinity according to the second embodiment.

Referring to FIG. 17, after the step shown in FIG. 16, the same steps as those shown in FIGS. 6 to 8 in the first embodiment are carried out. As a consequence, the center of the device isolation film LS around the center of the high voltage PMOSFET region as shown in FIG. 17 overlaps the gate end GTE in a plan view.

Figure 18:
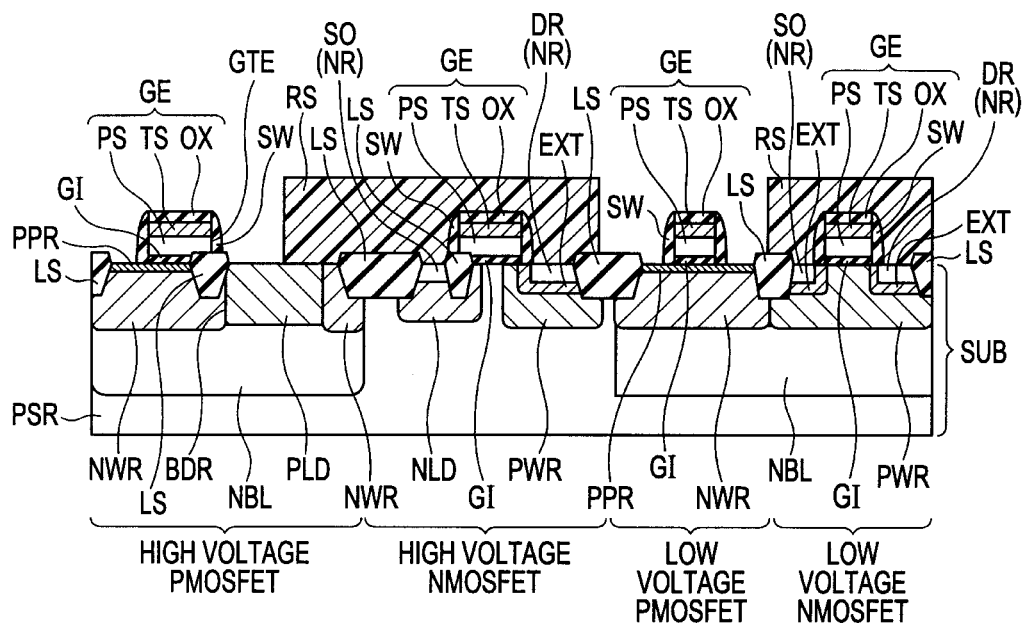
FIG. 18 is a schematic sectional view showing a step equivalent to the step in FIG. 10 in the first embodiment in the method for manufacturing a semiconductor device including the high voltage PMOS transistor shown in FIG. 13 and the low voltage transistor in its vicinity according to the second embodiment.

Referring to FIG. 18, after the step shown in FIG. 17, the same steps as those shown in FIGS. 9 and 10 in the first embodiment are carried out. However, in the photoresist RS pattern which is prepared for the next step, almost the entire portions corresponding to the high voltage PMOSFET region and low voltage PMOSFET region are openings unlike the step shown in FIG. 10 in the first embodiment.

Figure 19:
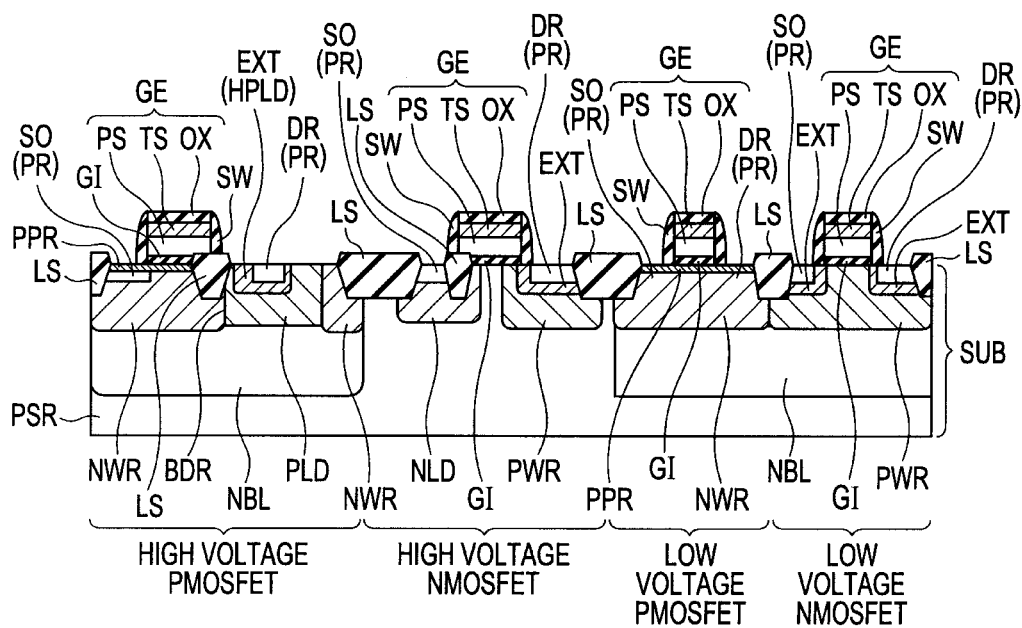
FIG. 19 is a schematic sectional view showing a step equivalent to the step in FIG. 11 in the first embodiment in the method for manufacturing a semiconductor device including the high voltage PMOS transistor shown in FIG. 13 and the low voltage transistor in its vicinity according to the second embodiment.

Referring to FIG. 19, after the step shown in FIG. 18, the same step as the step shown in FIG. 11 in the first embodiment is carried out. In the second embodiment, however, in both the high voltage PMOSFET region and low voltage PMOSFET region, p-type impurity regions PR are formed using the gate electrode GE as a mask in each of the regions. By taking the above steps, a semiconductor device with an insulating layer LS formed just below the end GTE of the gate electrode GE in the high voltage PMOSFET region is manufactured.

In the manufacturing method according to the second embodiment, the other steps not shown here are basically the same as the corresponding steps in the manufacturing method according to the first embodiment as shown in the relevant figures.

Figure 20:
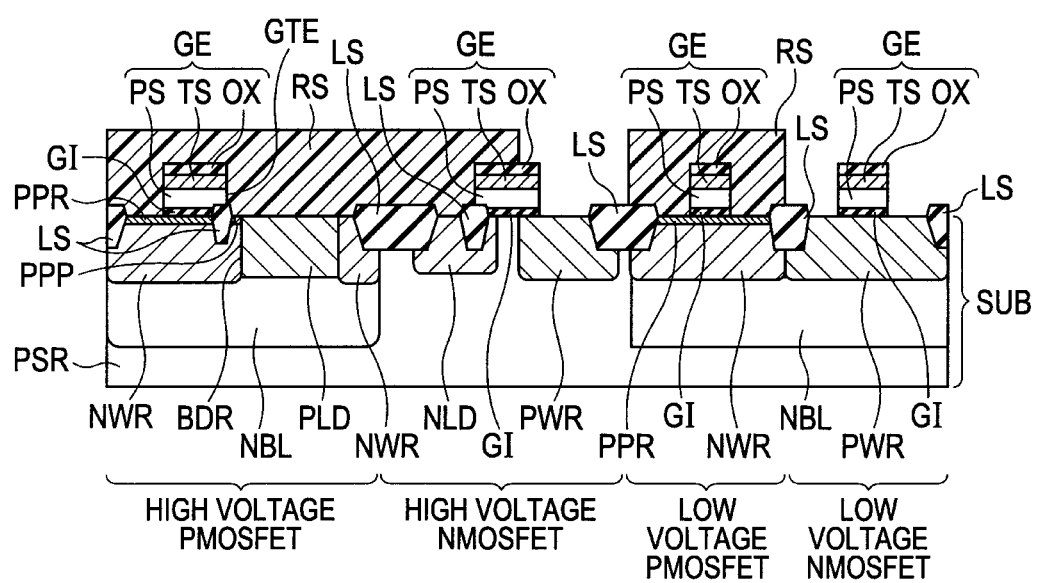
FIG. 20 is a schematic sectional view showing a step equivalent to the step in FIG. 8 in the first embodiment in the method for manufacturing a semiconductor device including the high voltage PMOS transistor shown in FIG. 15 and the low voltage transistor in its vicinity according to the second embodiment.

Referring to FIG. 20, the method for manufacturing the semiconductor device which combines the high voltage PMOSFET structure and low voltage PMOS structure according to the third example shown in FIG. 15 is almost the same as the above manufacturing method. The step shown in FIG. 20 is different from the step shown in FIG. 8 only in that the insulating layer LS is formed just below the gate end GTE. The insulating layer LS is formed at the step corresponding to the step shown in FIG. 3.

Next, the effect of the second embodiment will be described. In the high voltage PMOS transistor in the second embodiment, the insulating layer LS is located in a place where it overlaps the gate end GTE in a plan view. In the second embodiment as well, the n-type well region NWR and p-type buried channel PPR over it in the high voltage PMOS transistor are formed using the same mask continuously. Therefore, in the p-type buried channel PPR, a p-type very low doped region PPP (see FIG. 15) with a low impurity concentration and a high threshold voltage is formed particularly in the vicinity of the border BDR.

However, in the second embodiment, since the insulating layer LS overlaps the region PPP, the region with a high threshold voltage just below the gate electrode GE virtually disappears. This prevents such a problem as a drop in the drain current of the high voltage PMOS transistor or deterioration in its reliability which is attributable to a decline in the field effect of the gate electrode GE.

Furthermore, when the insulating layer LS according to the second embodiment is formed in the structure of high voltage PMOS transistor as shown in FIG. 15 in which the border BDR and the region PPP are nearer to the drain electrode DR than the gate end GTE, a decrease in the field effect in the p-type buried channel PPR just below the gate electrode GE is prevented more effectively.

The second embodiment of the present invention is different from the first embodiment thereof only in the abovementioned aspects. In other words, the second embodiment is the same as the first embodiment in terms of any structure, condition, procedure and effect that have not been described above.

The preferred embodiments disclosed herein should be considered to be just illustrative and not restrictive in all aspects. The scope of the present invention is defined by the appended claims rather than by the description preceding them, and all changes that fall within metes and bounds of the claims, or equivalence of such metes and bounds are therefore intended to be embraced by the claims.

The present invention is particularly advantageous when it is applied to semiconductor devices having a high voltage p-type channel transistor.

What is claimed is:

1. A semiconductor device having a high voltage p-channel transistor, the high voltage p-channel transistor comprising:
   a semiconductor substrate having a main surface and a p-type region therein:
   a p-type well region located over the p-type region and in the main surface, having a first p-type impurity region to obtain a drain electrode;
   an n-type well region located in a way to adjoin the p-type well region in a direction along the main surface, having a second p-type impurity region to obtain a source electrode;
   a gate electrode located between the first p-type impurity region and the second p-type impurity region in the direction along the main surface; and
   a p-type buried channel located over the n-type well region, extending along the main surface, wherein
   a border between a side of the n-type well region and a side of the p-type well region is located between the first p-type impurity region and an end of the gate electrode nearer to the first p-type impurity region,
   one end of the p-type buried channel is joined to the second p-type impurity region, and the other end of the p-type buried channel on the side of the first p-type impurity region is located nearer to the first p-type impurity region than one end of the gate electrode, the one end of the gate electrode being located on the side of the first p-type impurity region, and
   the semiconductor device further comprises a p-type low doped region between the p-type buried channel and the border, a p-type impurity concentration of the p-type low doped region being lower than that of the p-type buried channel.

2. The semiconductor device according to claim 1, wherein an insulating layer overlapping the gate electrode end near to the first p-type impurity region in a sectional view and having a sufficient thickness to reach a deeper level than a bottom of the p-type buried channel is located in the main surface of the semiconductor substrate.

3. The semiconductor device according to claim 1, further comprising:
   a low voltage p-channel transistor located in parallel with the high voltage p-channel transistor in the direction along the main surface over the p-type region of the semiconductor substrate.

4. The semiconductor device according to claim 1, wherein an extending line of the border does not overlap with the gate electrode in a sectional view.

5. The semiconductor device according to claim 1, wherein the p-type buried channel extends to a region under the end of the gate electrode near to the first p-type impurity region.

6. A semiconductor device having a high voltage p-channel transistor, the high voltage p-channel transistor comprising:
   a semiconductor substrate having a main surface and a p-type region therein:
   a p-type well region located over the p-type region and in the main surface, having a first p-type impurity region to obtain a drain electrode;
   an n-type well region located in a way to adjoin the p-type well region in a direction along the main surface, having a second p-type impurity region to obtain a source electrode;
   a gate electrode located between the first p-type impurity region and the second p-type impurity region in the direction along the main surface; and
   a p-type buried channel located over the n-type well region, extending along the main surface, wherein
   an insulating layer overlapping a gate electrode end near to the first p-type impurity region in a sectional view and having a sufficient thickness to reach a deeper level than a bottom of the p-type buried channel is located in the main surface of the semiconductor substrate,
   a border between a side of the n-type well region and a side of the p-type well region is located between the first p-type impurity region and an end of the gate electrode nearer to the first p-type impurity region,
   one end of the p-type buried channel is joined to the second p-type impurity region, and the other end of the p-type buried channel on the side of the first p-type impurity region is located nearer to the first p-type impurity region than one end of the gate electrode, the one end of the gate electrode being located on the side of the first p-type impurity region, and
   the semiconductor device further comprises a p-type low doped region between the p-type buried channel and the border, a p-type impurity concentration of the p-type low doped region being lower than that of the p-type buried channel.

7. The semiconductor device according to claim 6, wherein the border is located nearer to the first p-type impurity region than the gate electrode gate near to the first p-type impurity region.

8. The semiconductor device according to claim 6, further comprising:
   a low voltage p-channel transistor located in parallel with the high voltage p-channel transistor in the direction along the main surface over the p-type region of the semiconductor substrate.

9. The semiconductor device according to claim 6, wherein an extending line of the border does not overlap with the gate electrode in a sectional view.

10. The semiconductor device according to claim 6, wherein the p-type buried channel extends to a region under the end of the gate electrode near to the first p-type impurity region.

* * * * *